(12) United States Patent
Wang et al.

(10) Patent No.: US 11,990,575 B2
(45) Date of Patent: May 21, 2024

(54) LIGHT-EMITTING DEVICE

(71) Applicant: EPISTAR CORPORATION, Hsinchu (TW)

(72) Inventors: Hsin-Ying Wang, Hsinchu (TW); Chih-Hao Chen, Hsinchu (TW); Chien-Chih Liao, Hsinchu (TW); Chao-Hsing Chen, Hsinchu (TW); Wu-Tsung Lo, Hsinchu (TW); Tsun-Kai Ko, Hsinchu (TW); Chen Ou, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 18/205,920

(22) Filed: Jun. 5, 2023

(65) Prior Publication Data
US 2023/0317898 A1 Oct. 5, 2023

Related U.S. Application Data

(63) Continuation of application No. 17/306,141, filed on May 3, 2021, now Pat. No. 11,705,545.
(Continued)

(51) Int. Cl.
| H01L 33/60 | (2010.01) |
| H01L 21/78 | (2006.01) |
| H01L 33/08 | (2010.01) |
| H01L 33/14 | (2010.01) |
| H01L 33/38 | (2010.01) |
| H01L 33/44 | (2010.01) |
| H01L 33/46 | (2010.01) |
| H01L 33/54 | (2010.01) |
| H01L 33/56 | (2010.01) |

(Continued)

(52) U.S. Cl.
CPC .............. *H01L 33/60* (2013.01); *H01L 21/78* (2013.01); *H01L 33/38* (2013.01); *H01L 33/46* (2013.01); *H01L 33/54* (2013.01); *H01L 33/56* (2013.01)

(58) Field of Classification Search
CPC ......... H01L 33/10; H01L 33/46; H01L 33/22; H01L 33/44; H01L 33/08; H01L 33/60
See application file for complete search history.

(56) References Cited

U.S. PATENT DOCUMENTS

2017/0108173 A1   4/2017  Kim et al.
2019/0103515 A1*  4/2019  Ko .......................... H01L 33/62

FOREIGN PATENT DOCUMENTS

CN          110168755 A      8/2019

* cited by examiner

*Primary Examiner* — Antonio B Crite
(74) *Attorney, Agent, or Firm* — Patterson + Sheridan, LLP

(57) ABSTRACT

A light-emitting device comprises a substrate comprising a sidewall, a first top surface, and a second top surface, wherein the second top surface is closer to the sidewall of the substrate than the first top surface to the sidewall of the substrate; a semiconductor stack formed on the substrate comprising a first semiconductor layer, an active layer, and a second semiconductor layer; a dicing street surrounding the semiconductor stack, and exposing the first top surface and the second top surface of the substrate; a protective layer covering the semiconductor stack; a reflective layer comprising a Distributed Bragg Reflector structure covering the protective layer; and a cap layer covering the reflective layer, wherein the second top surface of the substrate is not covered by the protective layer, the reflective layer, and the cap layer.

17 Claims, 9 Drawing Sheets

Related U.S. Application Data

(60) Provisional application No. 63/019,948, filed on May 4, 2020.

(51) Int. Cl.
*H01L 33/00* (2010.01)
*H01L 33/22* (2010.01)

LIGHT-EMITTING DEVICE

REFERENCE TO RELATED APPLICATION

This application is a continuation application of U.S. patent application Ser. No. 17/306,141, filed on May 3, 2021, now pending, which claims the right of priority based on U.S. Provisional Application Ser. No. 63/019,948, filed on May 4, 2020, and the content of which is hereby incorporated by reference in its entirety.

TECHNICAL FIELD

The application relates to a light-emitting device, and more particularly, to a flip chip light-emitting device comprising a reflective mirror structure.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, the light-emitting diodes are widely used in the household appliances, the equipment indicators, and the optoelectronic products.

SUMMARY OF THE APPLICATION

In accordance with an embodiment of the present application, a light-emitting device comprises a substrate comprising a sidewall, a first top surface, and a second top surface, wherein the second top surface is closer to the sidewall of the substrate than the first top surface to the sidewall of the substrate; a semiconductor stack formed on the substrate comprising a first semiconductor layer, an active layer, and a second semiconductor layer; a dicing street surrounding the semiconductor stack, and exposing the first top surface and the second top surface of the substrate; a protective layer covering the semiconductor stack; a reflective layer comprising a Distributed Bragg Reflector structure covering the protective layer; and a cap layer covering the reflective layer, wherein the second top surface of the substrate is not covered by the protective layer, the reflective layer, and the cap layer.

In accordance with an embodiment of the present application, a light-emitting device comprises a substrate comprising a top surface; a semiconductor stack formed on the top surface of the substrate, the semiconductor stack comprising a first semiconductor layer, an active layer and a second semiconductor layer, wherein the first semiconductor layer comprises a mesa continuously surrounding a periphery of the semiconductor stack; a dicing street surrounding the semiconductor stack and exposing the top surface of the substrate; and an insulating reflective structure comprising a protective layer covering the mesa, a reflective layer comprising a Distributed Bragg Reflector structure covering the protective layer, and a compact layer covering the reflective layer, wherein the protective layer and the compact layer are in direct contact with each other on the mesa, the reflective layer is formed between the protective layer and the compact layer on the mesa, and the reflective layer does not contact the first semiconductor layer on the mesa.

DETAILED DESCRIPTION OF PREFERRED EMBODIMENTS

In order to make the description of the present application more detailed and complete, please refer to the description of the following embodiments and cooperate with the relevant illustrations. However, the examples shown below are used to illustrate the light-emitting device of the present application, and the present application is not limited to the following embodiments. In addition, the dimensions, materials, shapes, relative arrangements, etc. of the elements described in the embodiments in this specification are not limited to the description, and the scope of the present application is not limited to these, but is merely a description. In addition, the size or positional relationship of the elements shown in each figure is exaggerated for clear description. Furthermore, in the following description, in order to appropriately omit detailed descriptions, elements of the same or similar nature are shown with the same names and symbols.

Figure 1:
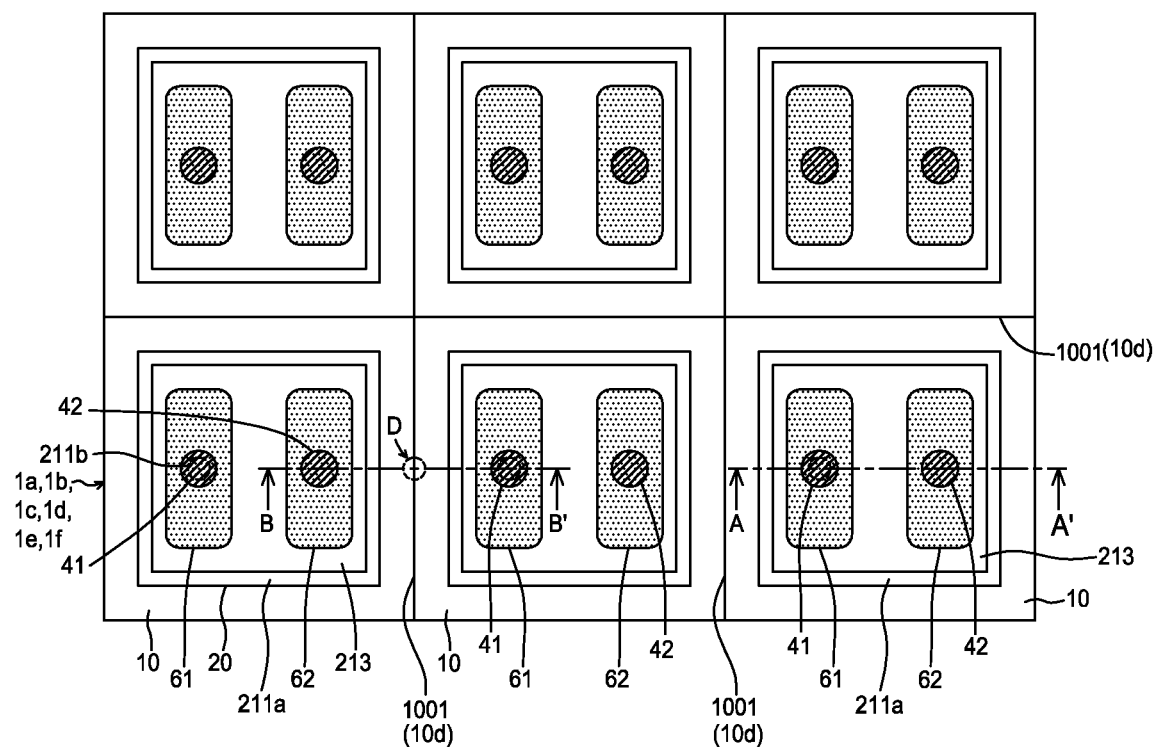
FIG. 1 illustrates a top view of a light-emitting device 1a, 1b, 1c, 1d, 1e, or 1f in accordance with an embodiment of the present application.
Figure 2A:
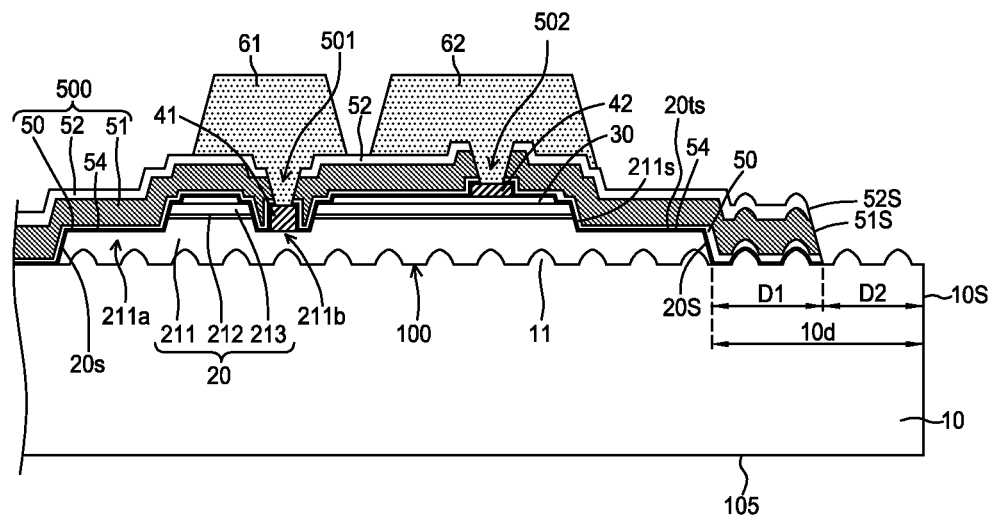
FIGS. 2A~2B illustrate a light-emitting device 1a and a manufacturing method thereof in accordance with another embodiment of the present application.
Figure 2B:
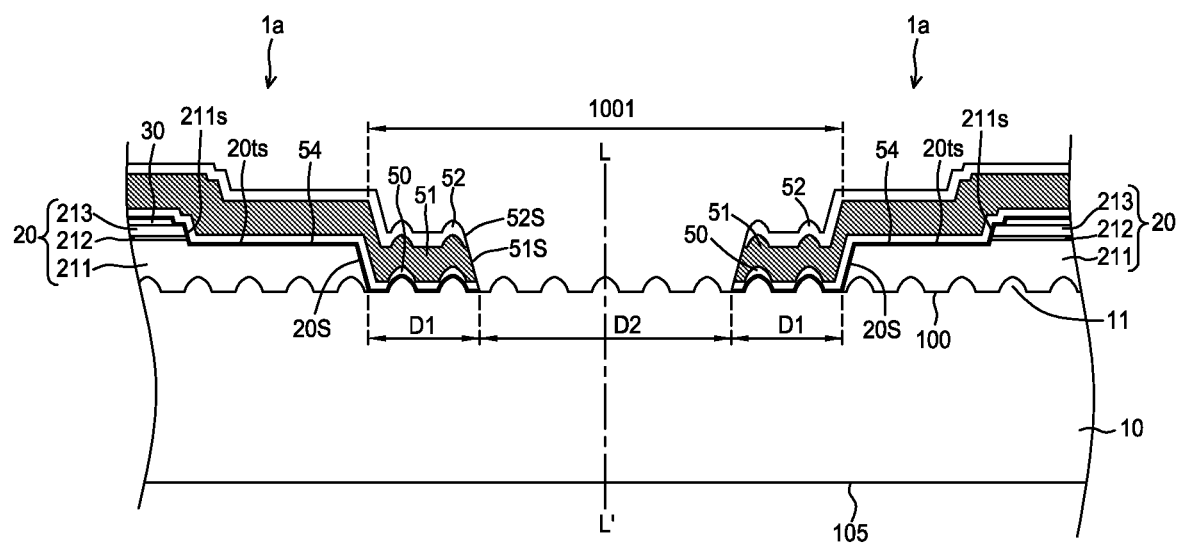
Figure 3A:
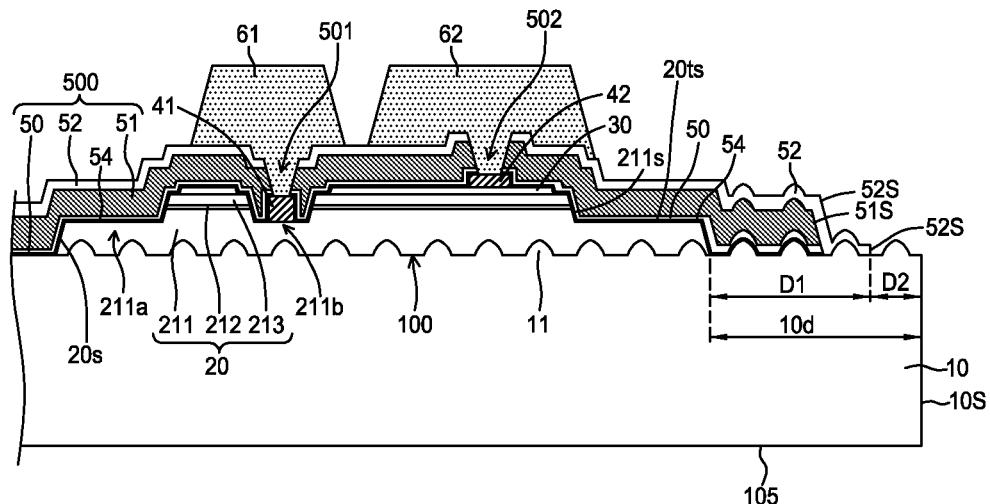
FIGS. 3A~3B illustrate a light-emitting device 1b and a manufacturing method thereof in accordance with another embodiment of the present application.
Figure 3B:
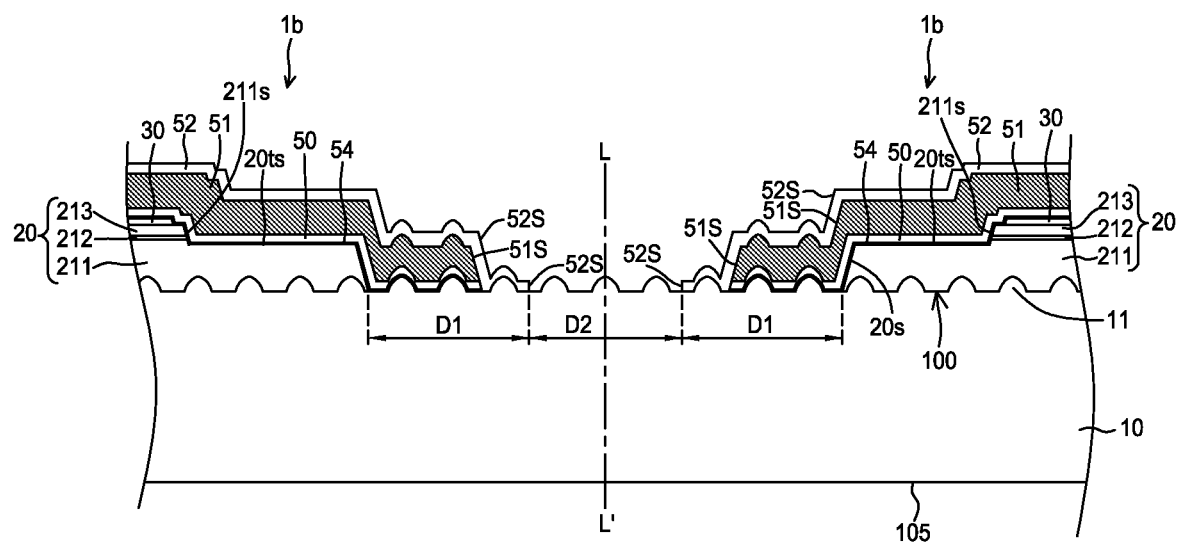

FIG. 1 illustrates a top view of a plurality of light-emitting device 1a, 1b, 1c, 1d, 1e, or 1f in accordance with an embodiment of the present application. FIGS. 2A~2B illustrate a light-emitting device 1a and a manufacturing method thereof in accordance with another embodiment of the present application. FIGS. 3A~3B illustrate a light-emitting device 1b and a manufacturing method thereof in accordance with another embodiment of the present application. In the following, for convenience of description, FIG. 2A and FIG. 3A are illustrated by the structure taken along the line A-A' of FIG. 1, FIG. 2B and FIG. 3B are illustrated by the structure of the position D on the line B-B' of FIG. 1, and some figures are omitted as appropriate.

A light-emitting device 1a or 1b comprises a substrate 10 comprising a top surface 100 and a sidewall 10S, wherein the top surface 100 comprises a first top surface D1 and a second top surface D2, and the second top surface D2 is closer to the sidewall 10S of the substrate 10 than the first top surface D1 to the sidewall 10S of the substrate 10; a semiconductor stack 20 formed on the top surface 100 of the substrate 10, the semiconductor stack 20 comprising a first semiconductor layer 211, an active layer 212 and a second semiconductor layer 213; a dicing street 10d surrounding the semiconductor stack 20 and comprising the first top surface D1 and the second top surface D2 of the substrate 10; a protective layer 50 covering the semiconductor stack 20; a reflective layer 51 comprising a Distributed Bragg Reflector formed on the protective layer 50; and a cap layer 52 covering the reflective layer 51, wherein the second top surface D2 of the substrate 10 is not covered by the protective layer 50, the reflective layer 51 and the cap layer 52.

As shown in FIG. 2A and FIG. 3A, the protective layer 50, the reflective layer 51, and the cap layer 52 cover the first top surface D1 of the substrate 10, but do not cover the second top surface D2 of the substrate 10. In the embodiment, as shown in FIG. 2A, an outer edge 52S of the cap layer 52 is aligned with an outer edge 51S of the reflective layer 51. In an embodiment, as shown in FIG. 3A, the cap layer 52 covers the outer edge 51S of the reflective layer 51 and directly contacts the top surface 100 of the substrate 10.

The substrate 10 can be a growth substrate for the epitaxial growth of the semiconductor stack 20. The substrate 10 comprises gallium arsenide (GaAs) wafer for growing aluminum gallium indium phosphide (AlGaInP), or sapphire ($Al_2O_3$) wafer, gallium nitride (GaN) wafer or silicon carbide (SiC) wafer for growing gallium nitride (GaN), indium gallium nitride (InGaN) or aluminum gallium nitride (AlGaN).

A side of the substrate 10 that is in contact with the semiconductor stack 20 comprises a rough surface. The rough surface comprises a surface having an irregular morphology or a surface having a regular morphology. For example, compared with the top surface 100, the substrate 10 comprises one or a plurality of protrusions 11 protruding from the top surface 100, or one or a plurality of recesses (not shown) recessed from the top surface 100. In a cross-sectional view, the protrusions 11 or the recesses (not shown) comprises hemispheres or pyramids. In order to increase the light-emitting efficiency of the light-emitting device, the protrusion 11 of the substrate 10 comprises a first layer and a second layer (not shown). The first layer comprises the same material as that of the substrate 10, such as gallium arsenide (GaAs), sapphire ($Al_2O_3$), gallium nitride (GaN), silicon carbide (SiC), or aluminum nitride (AlN). The second layer comprises a material different from the substrate 10 and the first layer. The material of the second layer comprises insulating materials, such as silicon oxide, silicon nitride, or silicon oxynitride. In an embodiment, the refractive index of the material of the second layer is between the refractive indices of the substrate 10 and the semiconductor stack 20. In an embodiment, a part of the dicing street 10d does not comprise the protrusion 11 or the recess. In an embodiment, when the dicing street 10d is formed, the protrusion 11 or the recess on the surface of the substrate 10 can be removed by etching, and the protective layer 50, the reflective layer 51, and the cap layer 52 covering the reflective layer 51 subsequently formed on the dicing street 10d can be better coated. When the material of the protrusion 11 and the substrate 10 are the same and both are materials of the epitaxial growth substrate, the protrusion 11 can be removed by dry etching or wet etching. When the material of the protrusion 11 is an insulating material, the protrusion 11 can be removed by dry etching or wet etching. Dry etching comprises plasma etching, excited state ion etching, inductively coupled plasma etching, or enhanced capacitive coupled plasma etching.

In an embodiment of the present application, the semiconductor stack 20 with photoelectrical characteristics, such as a light-emitting stack, is formed on the substrate by metal organic chemical vapor deposition (MOCVD), molecular beam epitaxy (MBE), hydride vapor phase epitaxy (HVPE), physical vapor deposition (PVD), or ion plating, wherein physical vapor deposition (PVD) comprises sputtering or evaporation.

The semiconductor stack 20 comprises the first semiconductor layer 211, the second semiconductor layer 213, and the active layer 212 formed between the first semiconductor layer 211 and the second semiconductor layer 213. The wavelength of the light emitted from the light-emitting device 1a or 1b is adjusted by changing the physical and chemical composition of one or more layers in the semiconductor stack 20. The material of the semiconductor stack 20 comprises a group III-V semiconductor material, such as $Al_xIn_yGa_{(1-x-y)}N$ or $Al_xIn_yGa_{(1-x-y)}P$, wherein $0 \leq x, y \leq 1$; $(x+y) \leq 1$. When the material of the semiconductor stack 20 comprises AlInGaP series material, the red light having a wavelength between 610 nm and 650 nm can be emitted. When the material of the semiconductor stack 20 comprises InGaN series material, the blue light having a wavelength between 400 nm and 490 nm can be emitted or the green light having a wavelength between 500 nm and 570 nm can be emitted. When the material of the semiconductor stack 20 comprises AlGaN or AlInGaN series material, the UV light having a wavelength between 250 nm and 400 nm can be emitted.

The first semiconductor layer 211 and the second semiconductor layer 213 can be confinement layers having different conductivity types, electrical properties, polarities, or doping elements for providing electrons or holes. For example, the first semiconductor layer 211 is an n-type semiconductor and the second semiconductor layer 213 is a p-type semiconductor. The active layer 212 is formed between the first semiconductor layer 211 and the second semiconductor layer 213. The electrons and the holes combine in the active layer 212 under a current driving to convert the electric energy into the light energy and then the light is emitted from the active layer 212. The active layer 212 can be a single heterostructure (SH), a double heterostructure (DH), a double-side double heterostructure (DDH), or a multi-quantum well structure (MQW). The material of the active layer 212 can be i-type, p-type, or n-type semiconductor. The first semiconductor layer 211, the second semiconductor layer 213, or the active layer 212 can be a single layer or a structure comprising a plurality of sub-layers.

In an embodiment of the present application, the semiconductor stack 20 further comprises a buffer layer (not shown) formed between the first semiconductor layer 211 and the substrate 10 which can release the stress caused by lattice mismatch between the materials of the substrate 10 and the semiconductor stack 20 so the lattice dislocation and the lattice defect are reduced and the epitaxial quality of the semiconductor stack 20 is improved. The buffer layer comprises a single layer or a structure comprising a plurality of sub-layers. In an embodiment, an aluminum nitride (AlN) layer formed by PVD method can be the buffer layer located between the semiconductor stack 20 and the substrate 10 to improve the epitaxial quality of the semiconductor stack 20. In an embodiment, when the method for forming aluminum nitride (AlN) is PVD, the target can be made of aluminum nitride. In another embodiment, a target made of aluminum reacts with a nitrogen source to form the aluminum nitride.

In an embodiment of the present application, the light-emitting device 1 comprises a first contact electrode 41 and a second contact electrode 42 formed on the same side of the semiconductor stack 20. The light-emitting device 1 can be a flip chip structure or a lateral chip structure.

In the embodiment, by removing a part of the second semiconductor layer 213 and the active layer 212, part of the first semiconductor layer 211 is exposed and a mesa 211*a* and one or a plurality of first electrical contact regions 211*b* can be formed. The side surface of the second semiconductor layer 213 and the active layer 212 exposed by etching is an inclined surface with respect to the exposed surface of the first semiconductor layer 211. The first contact electrode 41 is formed on the first electrical contact region 211*b* to contact the first semiconductor layer 211 and forms an electrical connection with the first semiconductor layer 211. The second contact electrode 42 is formed on the second semiconductor layer 213 and is electrically connected to the second semiconductor layer 213.

In an embodiment of the present application, in order to reduce the contact resistance and improve the current spreading efficiency, the light-emitting device 1 comprises a conductive layer 30 formed between the second semiconductor layer 213 and the second contact electrode 42. The material of the conductive layer 30 comprises a material that is transparent to the light emitted from the active layer 212, such as a metal material with a thickness smaller than 500 Å or a transparent conductive oxide. The transparent conductive oxide comprises indium tin oxide (ITO) or indium zinc oxide (IZO).

In an embodiment of the present application, the light-emitting device 1 comprises one or a plurality of current blocking layers (not shown) formed between the second semiconductor layer 213 and the conductive layer 30 and formed under the second contact electrode 42. The current blocking layer is formed of a non-conductive material comprising aluminum oxide ($Al_2O_3$), silicon nitride ($SiN_x$), silicon oxide ($SiO_x$), titanium oxide ($TiO_x$), or magnesium fluoride ($MgF_x$). In an embodiment, the current blocking layer comprises a Distributed Bragg Reflector (DBR), where the Distributed Bragg Reflector comprises insulating materials with different refractive indexes stacked on each other. In order to increase the light extraction efficiency of the light-emitting device, the current blocking layer has a light reflectivity of more than 80% for the light emitted from the active layer 212.

An insulating reflective structure 500 covers the semiconductor stack 20, the first contact electrode 41 and the second contact electrode 42 to reflect the light from the active layer 212 to a side of the substrate 10, such as the bottom surface 105 of the substrate 10. In the embodiment, in order to reduce the light absorbed by the metal reflective film, the insulating reflective structure 500 comprises an insulating material. The insulating reflective structure 500 may be formed as a single layer or a multilayer, but is preferably a multilayer structure. Specifically, the structure of the insulating reflective structure 500 is formed by sequentially stacking the protective layer 50, the reflective layer 51 and the cap layer 52, wherein the reflective layer 51 comprises a Distributed Bragg Reflector (DBR) structure.

In an embodiment of the application, more than one of the protective layer 50, the reflective layer 51, and the cap layer 52 can be omitted. In other words, the structure of the insulating reflective structure 500 comprises any one or two of the protective layer 50, the reflective layer 51 and the cap layer 52.

In an embodiment of the application, the protective layer 50 and/or the cap layer 52 comprises multilayers. Preferably, the cap layer 52 comprises a silicon oxide film in contact with the reflective layer 51 and a silicon nitride film formed on the silicon oxide film.

The insulating reflective structure 500 comprises a first insulating reflective structure opening 501 to expose the first contact electrode 41 and a second insulating reflective structure opening 502 to expose the second contact electrode 42. A first electrode pad 61 covers the first insulating reflective structure opening 501 to contact the first contact electrode 41 and forms an electrical connection with the first semiconductor layer 211. A second electrode pad 62 covers the second insulating reflective structure opening 502 to contact the second contact electrode 42 and forms an electrical connection with the second semiconductor layer 213.

In an embodiment of the application, the first contact electrode 41 and/or the second contact electrode 42 can be omitted. The first insulating reflective structure opening 501 exposes the first semiconductor layer 211 and/or the second insulating reflective structure opening 502 exposes the conductive layer 30. The first electrode pad 61 covers the first insulating reflective structure opening 501 to contact the first semiconductor layer 211, and/or the second electrode pad 62 covers the second insulating reflective structure opening 502 to contact the conductive layer 30.

The first contact electrode 41, the second contact electrode 42, the first electrode pad 61 and/or the second electrode pad 62 comprise a metal material comprising chromium (Cr), titanium (Ti), tungsten (W), gold (Au), aluminum (Al), indium (In), tin (Sn), nickel (Ni), platinum (Pt), silver (Ag) or an alloy of the above materials. The first electrode pad 61 and the second electrode pad 62 comprise single layer or multilayers. For example, the first electrode pad 61 or the second electrode pad 62 comprises Al/Pt stack, Ti/Au stack, Ti/Pt/Au stack, Cr/Au stack, Cr/Pt/Au stack, Ni/Au stack, Ni/Pt/Au stack, Cr/Al/Ti/Pt stack, Ti/Al/Ti/Pt/Ni/Pt stack, Cr/Al/Ti/Al/Ni/Pt/Au stack Cr/Al/Cr/Ni/Au stack or Ag/NiTi/TiW/Pt stack. The first electrode pad 61 and the second electrode pad 62 can be used as an electrical path for an external power source to supply current to the first semiconductor layer 211 and the second semiconductor layer 213. In the embodiment, when the first electrode pad 61 and the second electrode pad 62 comprise multiple layers, the metal structure of the first electrode pad 61 and the second electrode pad 62 connected to the external power source can be formed by alternately stacking gold (Au) and tin (Sn) or tin (Sn) and silver (Ag). The thickness or composition ratio of gold (Au) or silver (Ag) to tin (Sn) is 0.25% to 2.25%. In another embodiment, when the first electrode pad 61 and the second electrode pad 62 comprise gold (Au) and tin (Sn), gold (Au) is used as the outermost metal layer of the first electrode pad 61 and the second electrode pad 62. The first contact electrode 41, the second contact electrode 42, the first electrode pad 61 and/or the second electrode pad 62 comprise a thickness between 1 μm~100 μm, preferably between 1.2 μm~60 μm, and more preferably between 1.5 μm~6 μm. In an embodiment, the tin (Sn) metal layer of the first electrode pad 61 and/or tin (Sn) metal layer of the second electrode pad 62 each comprises a thickness between 3.5 μm and 8.5 μm. In another embodiment, the tin silver (SnAg) metal layer of the first electrode pad 61 and/or the tin silver (SnAg) metal layer of second electrode pad 62 each comprises a thickness between 8 μm~10 μm.

As described above, since the insulating reflective structure 500 covers the uneven structure of the semiconductor stack 20, the first contact electrode 41 and the second contact electrode 42, the height difference between the semiconductor stack 20, the first contact electrode 41 and the second contact electrode 42 affects the film quality of the insulating reflective structure 500. For example, when the insulating reflective structure 500 covers the semiconductor stack 20, at the interface between the side surface of the semiconductor stack 20 and the top surface 100 of the substrate 10, a fracture surface (not shown) is easily formed in the insulating reflective structure 500, and the external moisture tends to invade the semiconductor stack 20 along the fracture surface to reduce the reliability of the device.

In order to avoid the above-mentioned problem of the fracture surface, in the embodiment, by the better film coating characteristics of chemical vapor deposition (CVD), the protective layer 50 and the cap layer 52 are preferably formed by chemical vapor deposition (CVD), more preferably, by plasma enhanced chemical vapor deposition (PECVD).

In an embodiment of the application, the protective layer 50 and/or the cap layer 52 can be formed by atomic layer deposition.

The material of the protective layer 50 comprises silicon oxide, preferably has a thickness between 0.2 µm and 2 µm. If the thickness of the protective layer 50 is less than 0.2 µm, the protective layer 50 cannot cover the first contact electrode 41 and the second contact electrode 42 completely. If the thickness of the protective layer 50 is greater than 2 µm, the process time and the cost are increased when forming the first insulating reflective structure opening 501 and the second insulating reflective structure opening 502.

The material of the cap layer 52 comprises metal oxide, such as $Al_2O_3$; nitride, oxide or oxynitride, such as SiN, $SiO_x$ or $SiO_xN_y$. In an embodiment of the application, the cap layer 52 may be formed of a single layer structure by the above materials or a multilayer structure by a combination of the above materials. The cap layer 52 preferably comprises a thickness between 0.5 µm and 2.5 µm.

The reflective layer 51 is formed between the protective layer 50 and the cap layer 52. The reflective layer 51 comprises two or more materials of different refractive indexes alternately stacked to form a Distributed Bragg Reflector (DBR) structure, which selectively reflects the light of a specific wavelength. For example, layers of $SiO_2/TiO_2$ or $SiO_2/Nb_2O_5$ can be laminated to form an insulating reflective structure with high reflectivity. When $SiO_2/TiO_2$ or $SiO_2/Nb_2O_5$ is provided to form a Distributed Bragg Reflector (DBR) structure, each layer of the Distributed Bragg Reflector (DBR) structure is designed to comprise an optical thickness of one or an integral multiple of a quarter of the wavelength of the light emitted from the active layer 212. The thickness of the Distributed Bragg Reflector (DBR) can have a deviation of ±30% on the basis of one or the integral multiple of λ/4. Since the thickness of each layer of the Distributed Bragg Reflector (DBR) structure affects the reflectivity, it is preferable to use E-beam evaporation to form the reflective layer 51 to stably control the thickness of each layer of the Distributed Bragg Reflector (DBR) structure.

FIG. 1 is a schematic diagram of a wafer on which a plurality of light-emitting devices 1a, 1b, 1c, 1d, 1e, or 1f is formed. In the embodiment, in the top view, as shown in FIG. 1, the dicing areas 1001 divide the semiconductor stack 20 into a plurality of light emitting areas. The mesa 211a continuously surrounds the periphery of the semiconductor stack 20 of each plurality of light-emitting areas and is approximately a quadrilateral shape. In order to separate the plurality of light-emitting areas to form an individual light-emitting device, the dicing area 1001 requires a certain width to ensure that the light-emitting device is not damaged while reserving sufficient light-emitting areas, preferably between 1 µm~150 µm, more preferably between 5 µm~50 µm. When the dicing area 1001 is cut by a laser and/or a knife, the plurality of light-emitting devices 1a, 1b, 1c, 1d, 1e, or 1f formed on the wafer is separated into individual light-emitting devices 1, the physical impact force of the laser and/or knife scribing is likely to generate cracks in the insulating reflective structure 500 at the edge of the light-emitting device 1a, 1b, 1c, 1d, 1e, or 1f, especially the reflective layer 51. Moreover, once the crack spreads into the semiconductor stack 20, the external moisture easily penetrates into the semiconductor stack 20 along the crack, thereby reducing the reliability of the device.

In order to solve the above mentioned problems, the light-emitting device 1a, 1b, 1c, 1d, 1e, or 1f comprises a dicing street 10d, which is a part of the dicing area 1001 in the wafer cutting. The dicing street 10d is a preserved area on the light-emitting device 1a, 1b, 1c, 1d, 1e, or 1f after the dicing area 1001 is processed in the wafer cutting. The dicing street 10d is formed between the sidewall 10S of the substrate 10 and a sidewall 20S of the semiconductor stack 20, and the dicing street 10d comprises a width between 0.1 µm~50 µm, preferably less than 30 µm, more preferably less than 15 µm. The dicing street 10d exposes the top surface 100 of the substrate 10 and is located around the light-emitting device 1a, 1b, 1c, 1d, 1e, or 1f to surround the semiconductor stack 20. In a top view of the light-emitting device 1a, 1b, 1c, 1d, 1e, or 1f, the dicing street 10d comprises a first surface area, the semiconductor stack 20 comprises a second surface area, and a ratio of the first surface area to the second surface area is between 10~50%.

In an embodiment, in order to reserve more area for the mesa 211a to locate the first electrode pad 61 and the second electrode pad 62, an angle between the sidewall 20S of the semiconductor stack 20 and the top surface 100 of the substrate 10 is between 70 degrees and 110 degrees, preferably between 80 degrees and 100 degrees, and more preferably between 85 degrees and 95 degrees.

In an embodiment, in order to improve the film quality of the reflective layer 51 covering the sidewall 20S of the semiconductor stack 20 and avoid the cracking defect of the reflective layer 51, an angle between the sidewall 20S of the semiconductor stack and the top surface 100 of the substrate 10 is between 10 degrees and 50 degrees, preferably between 20 degrees and 40 degrees, and more preferably between 25 degrees and 35 degrees. In another embodiment, the sidewall 20S comprises inclined surfaces with different slopes. The inclined surface closer to the top surface 100 of the substrate is steeper than the inclined surface away from the top surface 100 of the substrate 10. For example, an angle between the inclined surface directly contacting the top surface 100 of the substrate 10 and the top surface 100 of the substrate 10 is between 50 degrees and 70 degrees. An angle between the inclined surface away from the top surface 100 of the substrate 10 and a horizontal plane parallel to the top surface 100 is between 30 degrees and 50 degrees.

In an embodiment of the application, before forming the protective layer 50, a compact layer 54 is formed on the top surface 100 of the substrate 10 and a surface 20ts of the semiconductor stack 20 by atomic layer deposition to directly cover the top surface 100 of the substrate 10 and the sidewalls 211s and 20S of the semiconductor stack 20. The material of the compact layer 54 comprises silicon oxide, aluminum oxide, hafnium oxide, zirconium oxide, yttrium oxide, lanthanum oxide, tantalum oxide, silicon nitride, aluminum nitride, or silicon oxynitride. In the embodiment, the interface between the compact layer 54 and the semiconductor stack 20 comprises the metal element and the oxygen, and the metal element comprises aluminum, hafnium, zirconium, yttrium, lanthanum, or tantalum. The compact layer 54 comprises a thickness between 400 Å and 2000 Å, preferably between 800 Å and 1600 Å, and more preferably between 1000 Å and 1400 Å.

The film formed by atomic layer deposition has good step coverage, thickness uniformity and higher density, thus the compact layer 54 devoid of pinholes can be conformally formed on the substrate 10 and the semiconductor stack 20. The compact layer 54 formed by atomic layer deposition prevents the moisture from penetrating into the semiconductor stack 20 along the gap between the substrate 10 and the semiconductor stack 20, or the void on the surface 20ts of the semiconductor stack 20.

In an embodiment of the application, more than one of the compact layer 54, the protective layer 50, the reflective layer 51, and the cap layer 52 can be omitted.

FIG. 2B discloses a manufacturing method of the light-emitting device 1a illustrated in FIG. 2A. FIG. 3B discloses a manufacturing method of the light-emitting device 1b illustrated in FIG. 3A. In the embodiment, along the line L-L', when the laser and/or the knife is provided to separate the plurality of light-emitting devices formed on the wafer into the individual light-emitting devices, the physical force of the laser and/or the knife scribing likely causes cracks in the insulating reflective structure 500 at the edge of the light-emitting device 1a or 1b, especially in the reflective layer 51. In order to solve the above problems, the present application provides the manufacturing method of the light-emitting device 1a or 1b comprising providing the substrate 10, wherein the substrate 10 comprises the top surface 100, and the top surface 100 comprises the first top surface D1 and the second top surface D2; forming the semiconductor stack 20 comprising the first semiconductor layer 211, the active layer 212 and the second semiconductor layer 213 on the substrate 10; removing a part of the semiconductor stack 20 to form a dicing area 1001 on the semiconductor stack 20 and a plurality of light-emitting devices 1a or 1b, wherein the dicing area 1001 exposes the first top surface D1 and the second top surface D2 of the substrate 10 provided before separation step, and the second top surface D2 is farther from the sidewall 20S of the semiconductor stack than the first top surface D1 to the sidewall 20S of the semiconductor stack 20; forming the protective layer 50 to cover each semiconductor stack 20 of the plurality of light-emitting devices 1a or 1b; forming a reflective layer 51 comprising a Distributed Bragg Reflector structure to cover the protective layer 50; forming a cap layer 52 to cover the reflective layer 51, wherein the protective layer 50, the reflective layer 51 and the cap layer 52 do not cover the second top surface D2 of the substrate 10; and separating the substrate 10 at a position on the second top surface D2 of the substrate 10 to form the plurality of light-emitting devices 1a or 1b. The first top surface D1 and the second top surface D2 of the substrate 10 after being separated are located on the dicing area 1001 (dicing street 10d).

As shown in FIGS. 2B and 3B, the protective layer 50, the reflective layer 51, and the cap layer 52 cover the first top surface D1 of the substrate 10, but do not cover the second top surface D2 of the substrate 10. In the embodiment, as shown in FIG. 2B, the outer edge 52S of the cap layer 52 is aligned with the outer edge 51S of the reflective layer 51, but the cap layer 52 does not directly contact the substrate 10. In an embodiment, as shown in FIG. 3B, the cap layer 52 covers the outer edge 51S of the reflective layer 51 and directly contacts the top surface 100 of the substrate 10.

In an embodiment of the application, more than one of the compact layer 54, the protective layer 50, the reflective layer 51 and the cap layer 52 can be omitted.

In an embodiment of the application, the substrate 10 is a sapphire substrate, the laser having a wavelength in the UV range, for example, 266 nm, 343 nm, or 355 nm, is used to melt the substrate 10 on the dicing area 1001 to form the concave portion (not shown). Then the invisible laser is provided to focus the focus point of the laser between the top surface 100 and the bottom surface 105 of the substrate 10 along the incident direction from the bottom surface 105 of the substrate 10, the plurality of damaged areas is formed along the separation line L-L' in the substrate 10, and then an external force is applied to separate the plurality of light-emitting devices 1 formed on the wafer into individual light-emitting devices 1a, 1b, 1c, 1d, 1e, or 1f along the plurality of damaged regions and the cleavage surface generated in the substrate 10 which extends towards the direction of the top surface 100 and the bottom surface 105 of the substrate 10. Compared with single laser scribing, UV laser combined with invisible laser scribing reduces the damage of light-emitting devices caused by oblique cracking. In an embodiment of the application, the invisible laser can be provided to focus for several times on different depths inside the substrate 10 to improve the scribing yield.

Figure 4A:
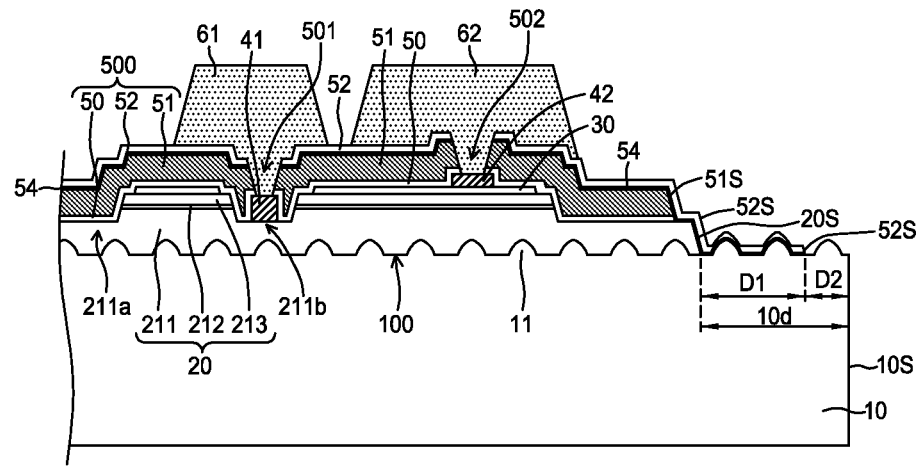
FIGS. 4A~4B illustrate a light-emitting device 1c and a manufacturing method thereof in accordance with another embodiment of the present application.
Figure 4B:
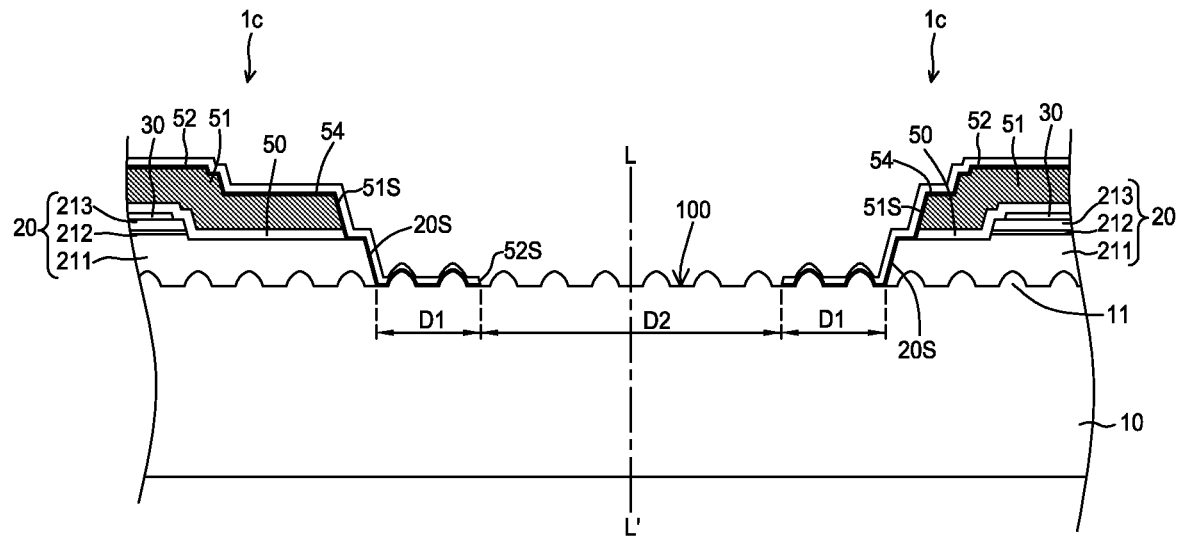
Figure 5A:
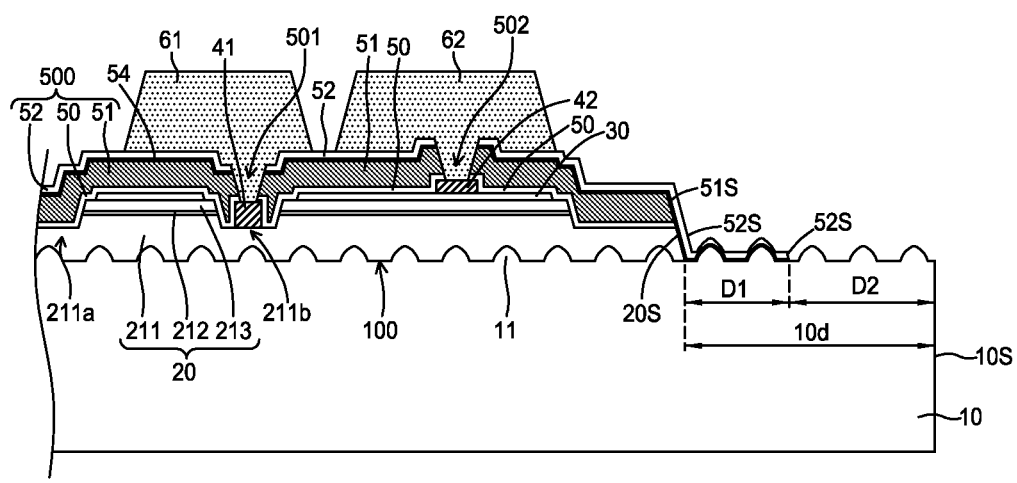
FIGS. 5A~5B illustrate a light-emitting device 1d and a manufacturing method thereof in accordance with another embodiment of the present application.
Figure 5B:
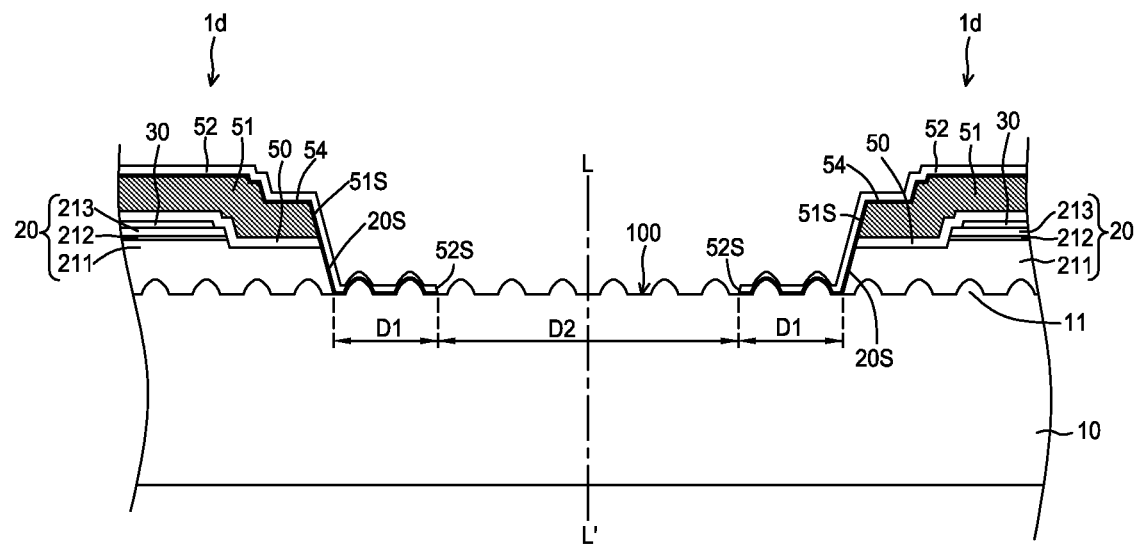
Figure 6A:
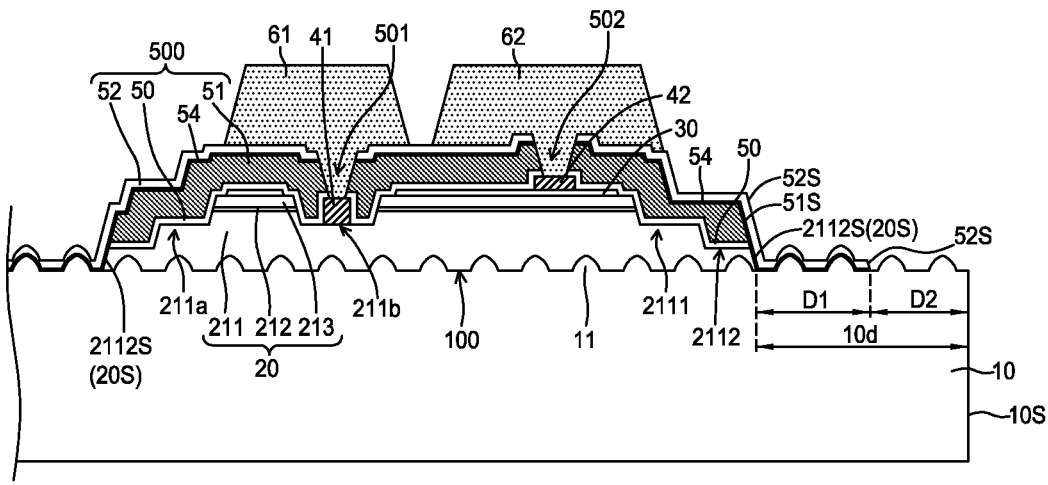
FIGS. 6A~6B illustrate a light-emitting device 1e and a manufacturing method thereof in accordance with another embodiment of the present application.
Figure 6B:
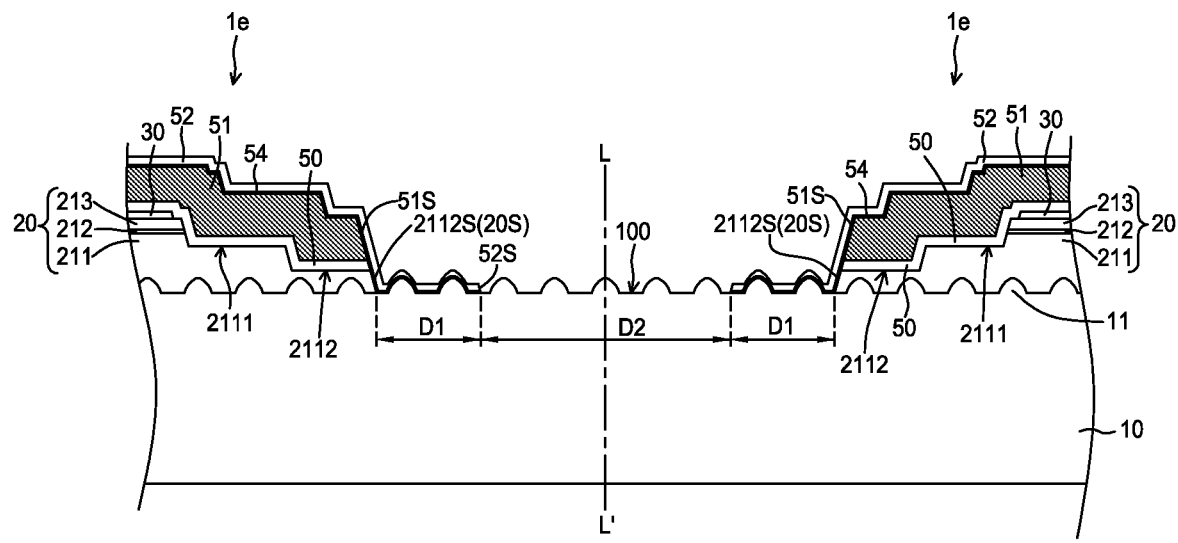

FIGS. 4A, 5A, and 6A illustrate partial cross-sectional views of the light-emitting devices 1c, 1d, and 1e in accordance with another embodiment of the present application. FIG. 4B illustrates a manufacturing method of the light-emitting device 1c of FIG. 4A. FIG. 5B illustrates a manufacturing method of the light-emitting device 1d of FIG. 5A. FIG. 6B illustrates a manufacturing method of the light-emitting device 1e of FIG. 6A. The light-emitting devices 1c, 1d, and 1e have substantially the same structure as that of the light-emitting device 1a or 1b so the structures of the light-emitting device 1c in FIGS. 4A~4B, the light-emitting device 1d in FIGS. 5A~5B, the light-emitting device 1e in FIGS. 6A~6B, and the light-emitting device 1a in FIG. 2A~FIG. 2B, the light-emitting device 1b in FIG. 3A~FIG. 3B having the same name and the same label have the same structure, the same material or the same function, and the descriptions are omitted or not repeated here.

The light-emitting device 1c, 1d, or 1e comprises a substrate 10, comprising a top surface 100 and a sidewall 10S, wherein the top surface 100 comprises a first top surface D1 and a second top surface D2, and the second top surface D2 is closer to a sidewall 10S of the substrate 10 than the first top surface D1 to the sidewall 10S of the substrate 10; a semiconductor stack 20 formed on the substrate 10, the semiconductor stack 20 comprising a first semiconductor layer 211, an active layer 212 and a second semiconductor layer 213; a dicing street 10d surrounding the semiconductor stack 20 and comprising the first top surface D1 and the second top surface D2 of the substrate 10; a protective layer 50 covering the semiconductor stack 20; a reflective layer 51, comprising a Distributed Bragg Reflector structure formed on the protective layer 50; and a cap layer 52 covering the reflective layer 51, wherein the second top surface D2 of the substrate 10 is not covered by the protective layer 51, the reflective layer 51 and the cap layer 52.

As shown in FIGS. 4A and 5A, the protective layer 50 and the reflective layer 51 do not cover the first top surface D1 of the substrate 10, but the cap layer 52 covers the first top surface D1 of the substrate 10. In the embodiment, as shown in FIG. 4A, an outer edge 51S of the reflective layer 51 and a sidewall 20S of the first semiconductor layer 211 are separated with a distance. In an embodiment of the present application, as shown in FIG. 5A, the outer edge 51S of the reflective layer 51 is aligned with the sidewall 20S of the first semiconductor layer 211.

In an embodiment of the application, before forming the cap layer 52, a compact layer 54 is formed on the top surface 100 of the substrate 10 and the semiconductor stack by atomic layer deposition to directly cover the top surface 100 of the substrate 10, the sidewall 20S of the semiconductor stack 20, and the outer edge 51S of the reflective layer 51. The material of the compact layer 54 comprises silicon oxide, aluminum oxide, hafnium oxide, zirconium oxide, yttrium oxide, lanthanum oxide, tantalum oxide, silicon nitride, aluminum nitride, or silicon oxynitride. In the embodiment, the interface of the compact layer 54 contacting the reflective layer 51, the cap layer 52, and the interface of the compact layer 54 contacting the sidewall 20S of the semiconductor stack 20 comprises the metal element and the oxygen. The metal element comprises aluminum, hafnium, zirconium, yttrium, lanthanum or tantalum. The compact layer 54 comprises a thickness between 400 Å and 2000 Å, preferably between 800 Å and 1600 Å, and more preferably between 1000 Å and 1400 Å.

The film formed by atomic layer deposition has good step coverage, thickness uniformity, and higher density, thus the compact layer 54 devoid of pinholes can be conformally formed on the substrate 10 and the semiconductor stack 20. The compact layer 54 formed by atomic layer deposition prevents the moisture from penetrating into the semiconductor stack 20 along the gap between the substrate 10 and the semiconductor stack 20, or the void on the surface of the semiconductor stack 20.

In an embodiment of the application, more than one of the compact layer 54, the protective layer 50, the reflective layer 51 and the cap layer 52 can be omitted.

In another embodiment, as shown in FIG. 6A, the first semiconductor layer 211 comprises a first mesa 2111 and a second mesa 2112, wherein the second mesa 2112 is closer to the sidewall 10S of the substrate 10 than the first mesa 2111 to the sidewall 10S of the substrate 10. An outer edge 51S of the reflective layer 51 is aligned with or separated from an outer edge 2112S of the second mesa 2112 (not shown).

In the embodiment, before forming the cap layer 52, a compact layer 54 is formed on the top surface 100 of the substrate 10 and the semiconductor stack 20 by atomic layer deposition to directly cover the top surface 100 of the substrate 10, the outer edge 2112S of the second mesa 2112, and the outer edge 51S of the reflective layer 51. The material of the compact layer 54 comprises silicon oxide, aluminum oxide, hafnium oxide, zirconium oxide, yttrium oxide, lanthanum oxide, tantalum oxide, silicon nitride, aluminum nitride, or silicon oxynitride. In the embodiment, the interface of the compact layer 54 contacting the reflective layer 51, the cap layer 52, and the interface of the compact layer 54 contacting the outer edge 2112S of the second mesa 2112 comprise the metal element and the oxygen, wherein the metal element comprises aluminum, hafnium, zirconium, yttrium, lanthanum or tantalum. The compact layer 54 comprises a thickness between 400 Å and 2000 Å, preferably between 800 Å and 1600 Å, and more preferably between 1000 Å and 1400 Å.

In an embodiment of the application, more than one of the compact layer 54, the protective layer 50, the reflective layer 51, and the cap layer 52 can be omitted.

FIG. 4B discloses a manufacturing method of the light-emitting device 1c illustrated in FIG. 4A. FIG. 5B discloses a manufacturing method of the light-emitting device 1d illustrated in FIG. 5A. FIG. 6B discloses a manufacturing method of the light-emitting device 1e illustrated in FIG. 6A. In the embodiment, along the line L-L', when a laser and/or a knife is provided to separate a plurality of light-emitting devices formed on a wafer into the individual light-emitting devices, the physical force of the laser and/or the knife scribing likely causes cracks in the insulating reflective structure 500 at the edge of the light-emitting device 1c, 1d or 1e, especially in the reflective layer 51. In order to solve the above problems, the present application provides a manufacturing method of a light-emitting device 1c, 1d or 1e comprising providing a substrate 10, wherein the substrate 10 comprises a top surface 100, and the top surface 100 comprises a first top surface D1 and a second top surface D2; forming a semiconductor stack 20 comprising a first semiconductor layer 211, an active layer 212 and a second semiconductor layer 213 on the substrate 10; forming a dicing street 10d to surround the semiconductor stack 20 at a periphery of the semiconductor stack 20 to expose the first top surface D1 and the second top surface D2 of the substrate 10, wherein the second top surface D2 is farther away from the sidewall 20S of the semiconductor stack 20 than the first top surface D1 to the sidewall 20S of the semiconductor stack 20; forming a protective layer 50 to cover the semiconductor stack 20; forming a reflective layer 51 comprising a Distributed Bragg Reflector structure to cover the protective layer 50; forming a cap layer 52 to cover the reflective layer 51, wherein the protective layer 50, the reflective layer 51 and the cap layer 52 do not cover the second top surface D2 of the substrate 10; and separating the substrate 10 to form a plurality of light-emitting devices 1c, 1d, or 1e at a position on the second top surface D2 of the substrate 10.

In an embodiment of the application, before forming the cap layer 52, a compact layer 54 is formed on the top surface 100 of the substrate 10 and the semiconductor stack by atomic layer deposition to directly cover the top surface 100 of the substrate 10, the outer edge 2112S of the second mesa 2112, and the outer edge 51S of the reflective layer 51. The material of the compact layer 54 comprises silicon oxide, aluminum oxide, hafnium oxide, zirconium oxide, yttrium oxide, lanthanum oxide, tantalum oxide, silicon nitride, aluminum nitride, or silicon oxynitride. In the embodiment, the interface of the compact layer 54 contacting the reflective layer 51, the cap layer 52, and the interface of the compact layer 54 contacting the outer edge 2112S of the second mesa 2112 comprises the metal element and the oxygen, and the metal element comprises aluminum, hafnium, zirconium, yttrium, lanthanum or tantalum. The compact layer 54 comprises a thickness between 400 Å and 2000 Å, preferably between 800 Å and 1600 Å, and more preferably between 1000 Å and 1400 Å.

In an embodiment of the application, more than one of the compact layer 54, the protective layer 50, the reflective layer 51 and the cap layer 52 can be omitted.

The protective layer 50 and the reflective layer 51 do not cover the first top surface D1 of the substrate 10, but the cap layer 52 covers the first top surface D1 of the substrate 10. In an embodiment where the compact layer 54 is not provided, the cap layer 52 directly contacts the first top surface D1 of the substrate 10. In an embodiment where the compact layer 54 is provided, the cap layer 52 does not contact the first top surface D1 of the substrate 10.

In the embodiment, as shown in FIG. 4B, an outer edge 51S of the reflective layer 51 is separated from a sidewall 20S of the first semiconductor layer 211 with a distance. In another embodiment, as shown in FIG. 5B, an outer edge 51S of the reflective layer 51 is aligned with a sidewall 20S of the first semiconductor layer 211.

In an embodiment, as shown in FIG. 6B, the first semiconductor layer 211 comprises a first mesa 2111 and a second mesa 2112, wherein the second mesa 2112 is closer to the sidewall 20S of the semiconductor stack 20 than the first mesa 2111 to the sidewall 20S of the semiconductor stack 20. An outer edge 51S of the reflective layer 51 and an outer edge 2112S of the second mesa 2112 are aligned or separated with a distance (not shown).

Figure 7A:
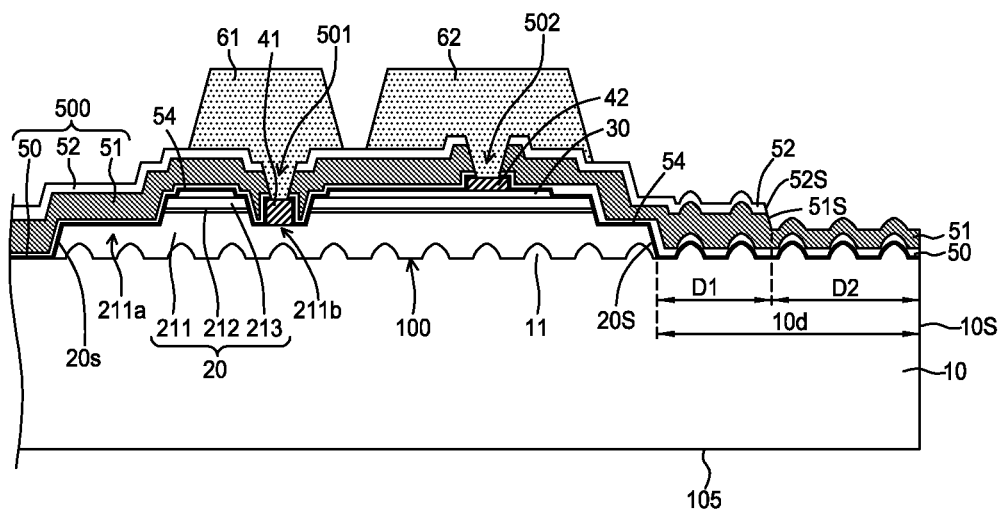
FIGS. 7A~7B illustrate a light-emitting device 1f and a manufacturing method thereof in accordance with another embodiment of the present application.
Figure 7B:
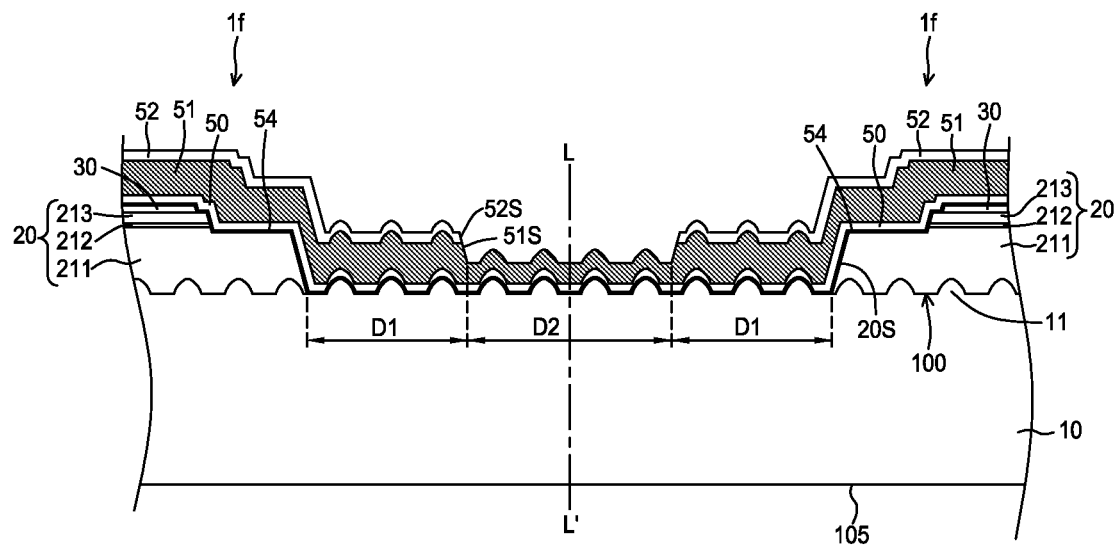

FIG. 7A illustrates a partial cross-sectional view of a light-emitting device 1f in accordance with another embodiment of the present application. FIG. 7B illustrates a manufacturing method of the light-emitting device 1f of FIG. 7A. In the following, for convenience of description, FIG. 7A is illustrated by the structure taken along the line A-A' of FIG. 1, FIG. 7B is illustrated by the structure of the position D on the line B-B' of FIG. 1, and some figures are omitted as appropriate. The light-emitting device 1f and the light-emitting device 1a or 1b have substantially the same structure. Therefore, the light-emitting device 1f in FIGS. 7A~7B and the light-emitting device 1a in FIGS. 2A~2B, the light-emitting device 1b in FIGS. 3A~3B have the same structure with the same name and reference number. The structure, the same material, or the same function is omitted here or not repeated here.

In the embodiment, a light-emitting device 1f comprises a substrate 10 comprising a top surface 100 and a sidewall 10S, wherein the top surface 100 comprises a first top surface D1 and a second top surface D2, the second top surface D2 is closer to the sidewall 10S of the substrate 10 than the first top surface D1 to the sidewall 10S of the substrate 10; a semiconductor stack 20 formed on the substrate 10 comprising a first semiconductor layer 211, an active layer 212 and a second semiconductor layers 213; a dicing street 10d surrounding the semiconductor stack 20 and comprising the first top surface D1 and the second top surface D2 of the substrate 10; a protective layer 50 and a reflective layer 51 covering the semiconductor stack 20, the first top surface D1 and the second top surface D2 of the substrate 10; a cap layer 52 covering the protective layer 50, the reflective layer 51 and the first top surface D1 of the substrate 10, wherein the second top surface D2 of the substrate 10 is not covered by the cap layer 52, and the substrate 10 is separated at a position on the second top surface D2 of the substrate 10 to form a plurality of light-emitting devices 1f.

In the embodiment, the reflective layer 51 comprises a Distributed Bragg Reflector structure.

The reflective layer 51 on the first top surface D1 comprises a first thickness, the reflective layer 51 on the second surface D2 comprises a second thickness, and the first thickness is greater than the second thickness.

In the embodiment, the reflective layer 51 can be omitted and/or the protective layer 50 and the cap layer 52 comprise different materials. For example, the protective layer 50 comprises $SiO_x$ and the cap layer 52 comprises $SiN_x$.

In an embodiment of the application, before forming the protective layer 50, a compact layer 54 is formed on the top surface 100 of the substrate 10 and a surface of the semiconductor stack 20 by atomic layer deposition to directly cover the top surface 100 of the substrate 10 and the surface of the semiconductor stack 20. The material of the compact layer 54 comprises silicon oxide, aluminum oxide, hafnium oxide, zirconium oxide, yttrium oxide, lanthanum oxide, tantalum oxide, silicon nitride, aluminum nitride, or silicon oxynitride. In the embodiment, the interface between the compact layer 54 and the semiconductor stack 20 comprises the metal element and the oxygen, and the metal element comprises aluminum, hafnium, zirconium, yttrium, lanthanum, or tantalum. The compact layer 54 comprises a thickness between 400 Å and 2000 Å, preferably between 800 Å and 1600 Å, and more preferably between 1000 Å and 1400 Å.

The film formed by atomic layer deposition has good step coverage, thickness uniformity, and higher density, thus the compact layer 54 devoid of pinholes can be conformally formed on the substrate 10 and the semiconductor stack 20. The compact layer 54 formed by atomic layer deposition prevents the moisture from penetrating into the semiconductor stack 20 along the gap between the substrate 10 and the semiconductor stack 20 or the void on the surface of the semiconductor stack 20.

In an embodiment of the application, more than one of the compact layer 54, the protective layer 50, the reflective layer 51, and the cap layer 52 can be omitted. When the reflective layer 51 is omitted from the light-emitting device 1f, the protective layer 50 covers the first top surface D1 of the substrate 10 and the second top surface D2 of the substrate 10. The cap layer 52 covers the first top surface D1 of the substrate 10, but does not cover the second top surface D2 of the substrate 10. In the process of removing the cap layer 52, a part of the protective layer 50 is removed. The protective layer 50 on the first top surface D1 comprises a first thickness, the protective layer 50 on the second surface D2 comprises a second thickness, and the first thickness is larger than the second thickness.

FIG. 7B illustrates a manufacturing method of the light-emitting device 1f of FIG. 7A. In the embodiment, along the line L-L', when a laser and/or a knife is used to separate a plurality of light-emitting devices formed on a wafer into individual light-emitting devices, the physical force of the laser and/or the knife scribing likely causes cracks in the insulating reflective structure 500 at the edge of the light-emitting device. In order to solve the above problems, the present application provides a manufacturing method of a light-emitting device 1f comprising providing a substrate 10, wherein the substrate 10 comprises a top surface 100, and the top surface 100 comprises a first top surface D1 and a second top surface D2; forming a semiconductor stack 20 comprising a first semiconductor layer 211, an active layer 212, and a second semiconductor layer 213 on the substrate 10; forming a dicing street 10d at a periphery of the semiconductor stack 20 to form a plurality of light-emitting devices 1f and expose the first top surface D1 and the second top surface D2 of the substrate 10, wherein the second top surface D2 is farther from the sidewall 20S of the semiconductor stack 20 than the first top surface D1 to the sidewall 20S of the semiconductor stack 20; and forming a protective layer 50, a reflective layer 51 and a cap layer 52 to cover the semiconductor stack 20 of the plurality of light-emitting devices 1f, the first top surface D1 of the substrate 10, wherein the protective layer 50 and the reflective layer 51 further cover the second top surface D2 of the substrate 10.

In an embodiment of the application, the manufacturing method of the light-emitting device 1f comprises forming a protective layer 50, a reflective layer 51 and a cap layer 52 on the second top surface D2 of the substrate 10, then removing the cap layer 52 by etching at a position on the second top surface D2 of the substrate 10, and remaining the protective layer 50 and the reflective layer 51.

In the step of etching and removing the cap layer 52, a part of the reflective layer 51 is also etched and removed, thus the reflective layer 51 comprises the first thickness on the first top surface D1 and a second thickness smaller than the first thickness on the second surface D2.

In an embodiment of the application, more than one of the compact layer 54, the protective layer 50, the reflective layer 51, and the cap layer 52 can be omitted. When the reflective layer 51 is omitted from the light-emitting device 1f, the first top surface D1 and the second top surface D2 of the substrate 10 are both covered by the protective layer 50. The protective layer 50 comprises a first thickness on the first top surface D1 and a second thickness smaller than the first thickness on the second top surfaces D2.

In the embodiment, the reflective layer 51 can be omitted and/or the protective layer 50 and the cap layer 52 comprise different materials, for example, the protective layer 50 comprises $SiO_x$ and the cap layer 52 comprises $SiN_x$.

In another embodiment of the application, the manufacturing method of the light-emitting device 1f comprises directly scribing the reflective layer 51, the protective layer 50 and the substrate 10 at a position on the second top surface D2 of the substrate 10 by a laser in the UV wavelength range, for example, 266 nm, 343 nm or 355 nm. The by-product of the UV laser scribing comprises the material elements composed of the reflective layer 51, the protective layer 50 and the substrate 10. The by-product of the laser scribing is removed by the wet etching. The etching solution used in the wet etching comprises hydrochloric acid (HCl), nitric acid ($HNO_3$), potassium hydroxide (KOH), sulfuric acid ($H_2SO_4$), phosphoric acid ($H_3PO_4$) or a combination of the above solutions. In an embodiment, when the size of the light-emitting device 1f is too small, such as on the order of micrometer, the subsequent etching process may be difficult to operate, and the by-product of the laser scribing can be optionally not removed. In another embodiment, after scribing the reflective layer 51, the protective layer 50, and the substrate 10 with a laser in the UV wavelength range, an invisible laser is then used. Along an incident direction of the bottom surface 105 of the substrate 10, the focal point of the invisible laser is focused between the top surface 100 and the bottom surface 105 of the substrate 10. A plurality of damaged areas are formed along the line L-L' in the substrate 10, and then an external force is applied to the cleavage planes generated along the plurality of damaged areas in an extension direction of the top surface 100 and the bottom surface 105 of the substrate 10 to form the individual light-emitting devices 1f. The by-product of the UV laser scribing comprises material elements composed of the reflective layer 51, the protective layer 50 and the substrate 10. The by-product can be selectively left, or the by-product of the laser scribing can be removed by the wet etching.

Figure 8:
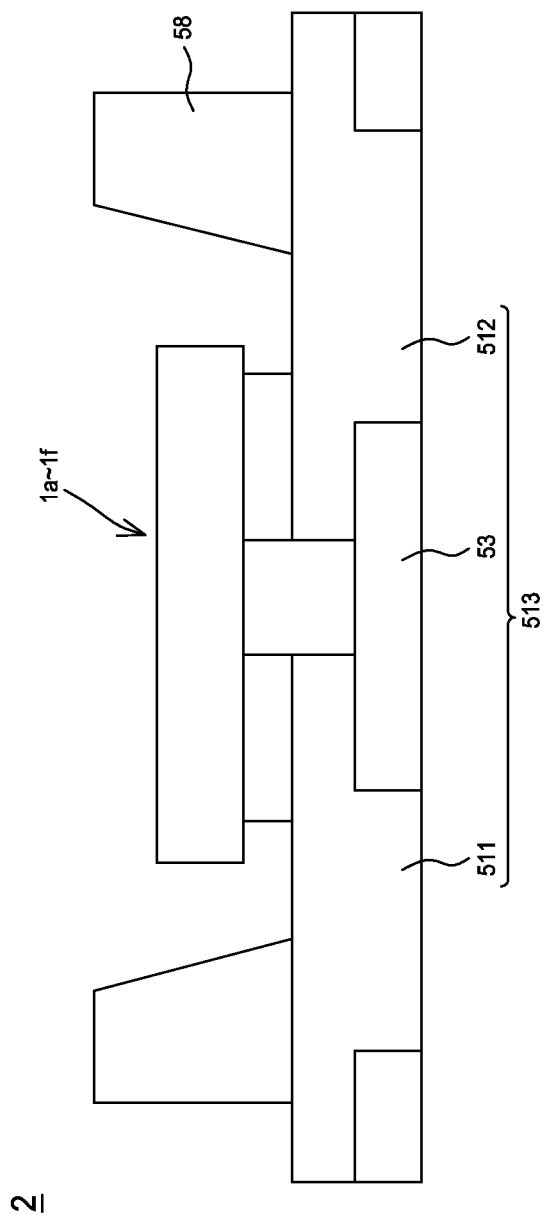
FIG. 8 illustrates a schematic view of a light-emitting apparatus 2 in accordance with an embodiment of the present application.

FIG. 8 is a schematic view of a light-emitting apparatus 2 in accordance with an embodiment of the present application. One of the light-emitting device 1a~1f in the foregoing embodiment is mounted on the first spacer 511 and the second spacer 512 of the package substrate 513 in the form of flip chip. The first spacer 511 and the second spacer 512 are electrically insulated from each other by an insulating portion 53 comprising an insulating material. The main light-extraction surface of the flip chip is one side of the growth substrate opposite to the electrode-forming surface where the electrodes are formed on. A reflective structure 58 can be provided around the light-emitting device 1a~1f to increase the light extraction efficiency of the light-emitting apparatus 2.

Figure 9:
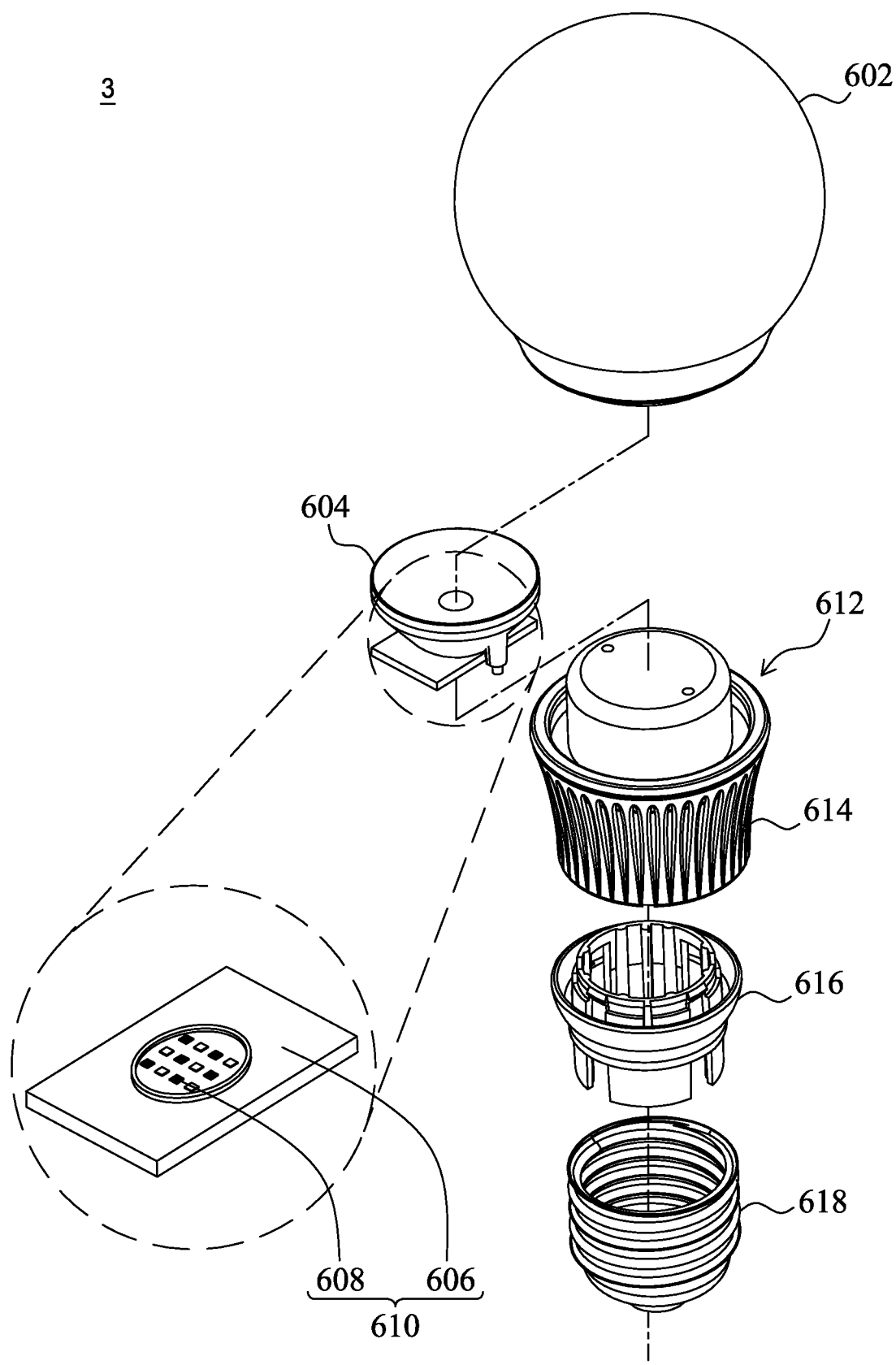
FIG. 9 illustrates a schematic view of a light-emitting apparatus 3 in accordance with an embodiment of the present application.

FIG. 9 illustrates a structure diagram of a light-emitting apparatus 3 in accordance with an embodiment of the present application. A light bulb comprises an envelope 602, a lens 604, a light-emitting module 610, a base 612, a heat sink 614, a connector 616 and an electrical connecting device 618. The light-emitting module 610 comprises a submount 606 and a plurality of light-emitting devices 608 on the submount 606, wherein the plurality of light-emitting devices 608 can be the light-emitting device 1a~1f or the light-emitting apparatus 2 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a substrate, comprising a top surface;
a semiconductor stack formed on the top surface of the substrate, the semiconductor stack comprising a first semiconductor layer, an active layer and a second semiconductor layer, wherein the first semiconductor layer comprises a mesa continuously surrounding a periphery of the semiconductor stack;
a dicing street surrounding the semiconductor stack and exposing the top surface of the substrate; and
an insulating reflective structure comprising a protective layer covering the mesa, a reflective layer comprising a Distributed Bragg Reflector structure covering the protective layer, and a compact layer covering the reflective layer,
wherein the protective layer and the compact layer are in direct contact with each other on the mesa, the reflective layer is formed between the protective layer and the compact layer on the mesa, and the reflective layer does not contact the first semiconductor layer on the mesa.

2. The light-emitting device according to claim 1, wherein the protective layer and the compact layer contact the first semiconductor layer.

3. The light-emitting device according to claim 1, wherein the protective layer or the reflective layer do not cover the top surface of the substrate.

4. The light-emitting device according to claim 1, wherein the protective layer and the reflective layer do not cover the top surface of the substrate.

5. The light-emitting device according to claim 1, wherein the protective layer comprises silicon oxide.

6. The light-emitting device according to claim 1, wherein the compact layer comprises silicon oxide, aluminum oxide, hafnium oxide, zirconium oxide, yttrium oxide, lanthanum oxide, tantalum oxide, silicon nitride, aluminum nitride, or silicon oxynitride.

7. The light-emitting device according to claim 1, wherein an interface of the compact layer contacting a sidewall of the semiconductor stack comprises a metal element and oxygen.

8. The light-emitting device according to claim 1, wherein the insulating reflective structure comprises a first insulating reflective structure opening on the first semiconductor layer and a second insulating reflective structure opening on the second semiconductor layer.

9. The light-emitting device according to claim 8, further comprising a first electrode pad covering the first insulating reflective structure opening and a second electrode pad covering the second insulating reflective structure opening.

10. The light-emitting device according to claim 1, further comprising a first electrode pad passing through the protective layer, the reflective layer, and the compact layer.

11. The light-emitting device according to claim 10, further comprising a second electrode pad passing through the protective layer, the reflective layer, and the compact layer.

12. The light-emitting device according to claim 1, wherein the compact layer contacts the top surface of the substrate.

13. The light-emitting device according to claim 12, wherein an outer edge of the protective layer is aligned with an outer edge of the reflective layer.

14. The light-emitting device according to claim 13, wherein the compact layer covers the outer edge of the reflective layer.

15. The light-emitting device according to claim 13, wherein the outer edge of the reflective layer is separated from a sidewall of the first semiconductor layer by a distance, and the sidewall of the first semiconductor layer connects the top surface of the substrate.

16. The light-emitting device according to claim 15, wherein an angle between the sidewall of the first semiconductor layer and the top surface of the substrate 10 is between 70 degrees and 110 degrees.

17. The light-emitting device according to claim 15, wherein an angle between the sidewall of the first semiconductor layer and the top surface of the substrate 10 is between 10 degrees and 50 degrees.

* * * * *